(12) United States Patent
Wang

(10) Patent No.: US 11,031,079 B1
(45) Date of Patent: Jun. 8, 2021

(54) DYNAMIC DIGITAL PERCEPTRON

(71) Applicant: FlashSilicon Incorporation, Diamond Bar, CA (US)

(72) Inventor: Lee Wang, Diamond Bar, CA (US)

(73) Assignee: FLASHSILICON INCORPORATION, Diamond Bar, CA (US)

(*) Notice: Subject to any disclaimer, the term of this patent is extended or adjusted under 35 U.S.C. 154(b) by 0 days.

(21) Appl. No.: 16/698,125

(22) Filed: Nov. 27, 2019

(51) Int. Cl.
 G11C 15/04 (2006.01)
 G06N 3/063 (2006.01)
 G11C 11/54 (2006.01)

(52) U.S. Cl.
 CPC ............. *G11C 15/04* (2013.01); *G06N 3/063* (2013.01); *G11C 11/54* (2013.01)

(58) Field of Classification Search
 CPC ......... G11C 16/08; G11C 16/26; G11C 11/54; G11C 15/04
 See application file for complete search history.

(56) References Cited

U.S. PATENT DOCUMENTS

| | | | |
|---|---|---|---|
| 5,576,985 A | 11/1996 | Holtz | |
| 5,893,929 A | 4/1999 | Shadan et al. | |
| 6,078,987 A | 6/2000 | Kongetira | |
| 6,317,349 B1 | 11/2001 | Wong | |
| 7,031,177 B2 | 4/2006 | De Sandre | |
| 7,319,608 B2 | 1/2008 | Hsu et al. | |
| 8,559,232 B2 | 10/2013 | Lee et al. | |
| 9,502,113 B2 | 11/2016 | Wang | |
| 9,754,668 B1 * | 9/2017 | Wang | G11C 15/04 |

* cited by examiner

Primary Examiner — Tuan T Nguyen

(57) ABSTRACT

A dynamic digital perceptron device is disclosed. The dynamic digital perceptron device of the invention comprises a volatile content memory array, a detection and driver circuit and a volatile response memory array. The dynamic digital perceptron device processes input digital information according to a database of the digital content data stored in the volatile content memory array and outputs the correspondent digital data stored in the volatile response memory array by the detection and driver circuit. Moreover, the volatile content memory array and the volatile response memory array in the dynamic digital perceptron device are constructed by the latch-types of memory cells to handle the rapid and frequent changing digital processing environments.

21 Claims, 11 Drawing Sheets

DYNAMIC DIGITAL PERCEPTRON

BACKGROUND OF THE INVENTION

Field of the Invention

The invention is related to a new digital in-memory processor without computations. That is, the digital in-memory processor processes input digital information according to a database of the digital content data stored in a volatile content memory and output the correspondent digital response data stored in a volatile response memory. In particular, the content memory and the response memory in the digital in-memory processor can be rapidly uploaded for the new digital processing environments.

Description of the Related Art

In the modern Von Neumann computing architecture as shown in FIG. 1, the Central Process Unit (CPU) executes logic operations according to the instructions and data from the main memory. The CPU 10 includes a main memory 11, an arithmetic and logic unit 12, an input/output equipment 13 and a program control unit 14. Prior to the computation process, the CPU 10 is set by the program control unit 14 to point to the initial address codes for the initial instruction in the main memory. The digital data are then processed with the arithmetic and logic unit 12 according to the sequential instructions in the main memory 11 accessed by the clock-synchronized address pointer in the program control unit 14. In general, the digital logic computation process for CPU 10 is synchronously executed and driven by a set of pre-written sequential instructions stored in the memory.

The power consumption for digital computations is given by $P \sim f^*C^*V_{DD}^2$, where f is the clock frequency, C is the total active circuit capacitance and $V_{DD}$ is the positive voltage supply for digital circuitries. Accordingly, the energy requirement for running a computation sequence is proportional to the numbers of clock steps to complete the set of instructions. Each instruction step includes fetching the instruction and data from memory, executing the micro-operations in arithmetic and logic unit, and storing the resultant data back to the memory or outputting to the I/O (Input/Output) unit. The total computation energy for completing a set of instructions is proportional to the frequency of memory accessing and the charging/discharging the total capacitances of the bus-lines and the active digital circuitries (registers, logic gates, and multiplexers). The more frequent memory accessing to complete the computation processing steps, the more energy and processing time are consumed for the digital processors.

While for a biologic nerve system the external stimuli such as lights, sounds, touches, tastes, and smells, are received by the fields of sensory organs connected to the nerve system. The neural signals in the forms of electrical pulses and neural transmitters (molecules) generated in the receptor fields are propagated to trigger the activation of next connecting layer of the neural network in the nerve system. The field of neural signals generated from the connecting layer continues to process forward throughout the multiple layers of the neural network hardware in the nerve system. Each neural network layer is parallel processing and extracting the information according to its neuromorphic structures and the receptive fields of neural signals from the previous layers. Unlike the present Von Neumann computing system iterating multiple logic computations for digital data by the pre-written instructions, the neural signals for information processing are propagated layer-to-layer in one-step feed-forward fashion by their neuromorphic structures. Therefore, in terms of information processing efficiencies and energy consumptions, the parallel processing and extracting information for layers of neural network in biologic nerve systems are superior to the processing and extracting information by multiple sequential logic computations in the present computing systems.

Inspired by the neural network information parallel processing, we are motivated to invent a digital memory processor analogy to the information processing in neural network systems directly by the processor's memory hardware for parallel processing digital signals within one feed-forward step. A digital symbol for digital information processing is generally represented by a string of bits in the combination of "0s" and "1s", where the signals of "1" and "0" are provided by the applying positive voltage $V_{DD}$ and the ground voltage $V_{SS}$ in digital circuitries respectively. An input digital symbol with multiple bits representing specific input content information can be intelligently processed to output another digital symbol representing the perceived/response information by the memory processor. The processor is given by the name of "Digital Perceptron". The meaning of "intelligently processed" is that the perceptive/response information is autonomously processed with the input digital "content" symbol according to a pool of known knowledge of digital "content" symbols. In contrast to the "content" processing, CPU processes digital information with logic operations and memory by pointing to the address locations. While the logic contents of look-up-tables in FPGA (Field Programmable Gate Array) are extracted for digital information processing by configuring their address multiplexers through connections.

The digital perceptron can be configured to store a group of digital content symbols and their correspondent digital output symbols in the memory units similar to the built-in neural network hardware. The group of digital symbols can represent various scenarios in real world as the digital contents. The correspondent digital output symbols could be digital commands to drive an analog device or the input digital symbols for other digital perceptrons. In the previous invention disclosed in U.S. Pat. No. 9,754,668 B1, we apply configurable non-volatile memory arrays in the digital perceptron for storing digital content symbols and digital responsive/perceptive symbols. Since the non-volatile memory arrays can be also configured multiple times for various processes in response to the new information processing environments such as the updated digital information obtained from new input data sets or new applied algorithms.

Since some digital information processing such as Digital Signal Process (DSP) for videos or voices, the convolution coefficients calculated from real-time new data sets for various nodes/layers in the Deep Neural Network (DNN) learning models, requires the information processing environments to be updated rapidly and frequently. A digital perceptron with the fast and frequent update capability will be very desirable. It is well-known that the configuration time (~10 s ms to ~µs for the typical floating gate non-volatile memory devices) and the endurance of write times (~100 k times for the typical floating gate non-volatile memory devices) for the non-volatile memory devices are inferior to those for the volatile memory devices (SRAM and DRAM) usually applied in the conventional Von Neumann computing processor systems. In this invention, we construct the "Working Digital Perceptron (WDP)" based on the fast-write and high-endurance latch-type of memory cells for the volatile content memory arrays and the volatile response memory arrays for handling the fast and frequent changing information processing environments. The function of WDP is very similar to the function of "working memory" in brain processing systems. Note that the concept of "working memory" is well known and defined in the field of neuroscience.

SUMMARY OF THE INVENTION

To fulfill the above described functions of "Working Digital Perceptron (WDP)", we have constructed the WDP 200 in FIG. 2 with an n*m series Content Addressable Memory (CAM) array 300, a q*m Static Random Access Memory (SRAM) array 700, an n-bit Input Buffer and Driver unit 900, a q-bit Output Buffer and Driver Unit 110, a Write Wordline Driver Unit 400, an n-bit SRAM Write Driver Unit 500, a q-bit SRAM Write Driver Unit 750, a Match Logic Unit 800, a Match-Detector Unit 610 and a Write Selection and Wordline Driver Unit 620.

In FIG. 2, the WDP 200 are connected to the n-bit input Bus-Lines 20 for receiving the input digital data signals and the q-bit output Bus-Lines 27 for sending out the output digital signals. The write-content Bus-Lines 22 and the write-response Bus-Lines 23 are connected to the n-bit SRAM Write Driver Unit 500 and the q-bit SRAM Write Driver Unit 750, respectively. When the control signal "WDin" at node 24 goes "high", the SRAM Write Driver Units 500 and 750 receive and store a row of n-bit SRAM data signals and a row of q-bit SRAM data signals from the write-content Bus-Lines 22 and the write-response Bus-Lines 23, respectively. While the write enable signal ("WEnb") goes "high" at node 25, the SRAM Write Driver Units 500 and 750 simultaneously write a row of n-bit content data and a row of q-bit response data respectively into the Bit-Lines 302 of CAM array 300 and the Bit-Lines 702 of SRAM array 700 with a selected wordline $WC_i$ activated in the Write Wordline Driver Unit 400 and with the corresponding wordline $WR_i$ (in the same row as the wordline $WC_i$) continuously activated in the SRAM array 700, where $0=<i<=(m-1)$. The selection of the wordlines 301 is done by activating a "high" signal at one of the wordline selection nodes 21 connected to a wordline decoder 40 (see FIG. 4). The "n-bit" content data for the CAM array 300 and "q-bit" response data for the response SRAM array 700 are then written row by row up to the "m" rows of the memory arrays 300 and 700. The number m of n-bit content data in the CAM array 300 and the number m of q-bit response data in the SRAM array 700 are adaptively updated for a fast and frequent changing information processing environment similar to an information processing function of a working memory in a human brain.

With the processing data already stored in the CAM array 300 and the response SRAM array 700, the WDP 200 is activated by the enable signal "Enb" with a high voltage $V_{DD}$ at node 26 in FIG. 2. The input data signals from the n-bit Input Bus-Lines 20 are passed into the n-bit Input Buffer and Driver Unit 900 for searching the inputted digital data string to match a row of content data in the CAM array 300. When the inputted digital data match a row of digital content data in CAM 300, its correspondent match-line electrically connects its right-hand node to its left-hand node biased at the ground potential. Otherwise, all the un-matched match-lines of the CAM array 300 remain floating at their right-hand nodes due to the electrically broken match-lines. The voltage signals at the right-hand nodes of the "m" Match-Lines 303 are then fed into the Match-Detector Unit 610. The voltage signal for a matched match-line is pulled down to the ground voltage for the correspondent match-detector 61 to generate the high voltage signal $V_{DD}$ by the Write Selection and Wordline Driver unit 620 further to turn on the correspondent wordline in the q-bit by m-row SRAM array 700, while the other wordlines in the SRAM array 700 remain off for their correspondent un-matched match-lines. The voltage signals of the q-bit response code stored in the correspondent row pass to the q-bit Output Buffer and Driver Unit 110 by the 2*q Bit-Lines 702.

To eliminate the false response for the irrelevant content inputs, the q-bit Output Buffer and Driver Unit 110 is connected to the external Output Bus-Lines 27 if and only if there is a match between the n-bit input data and a row of content data in CAM array 300. Referring to FIGS. 2 and 6, a match signal MH with a high voltage $V_{DD}$ at node 65 from the Match-Detector Unit 610 for a match is sent to the Match Logic Unit 800. While the WDP 200 is activated by the Enb signal with a high voltage $V_{DD}$ at node 26, the Match Logic Unit 800 will send out the OE signal with a high voltage $V_{DD}$ at node 81 to connect the q-bit Output Buffer and Driver Unit 110 with the external Output Bus-Lines 27 for sending out the correspondent response data voltage signals of the relevant digital content to other units.

BRIEF DESCRIPTION OF THE DRAWINGS

For a better understanding of the present invention and to show how it may be carried into effect, reference will now be made to the following drawings, which show the preferred embodiment of the present invention, in which.

DETAILED DESCRIPTION OF THE INVENTION

The following detailed description is meant to be illustrative only and not limiting. It is to be understood that other embodiment may be utilized and element changes may be made without departing from the scope of the present invention. Also, it is to be understood that the phraseology and terminology used herein are for the purpose of description and should not be regarded as limiting. Those of ordinary skill in the art will immediately realize that the embodiments of the present invention described herein in the context of methods and schematics are illustrative only and are not intended to be in any way limiting. Other embodiments of the present invention will readily suggest themselves to such skilled persons having the benefits of this disclosure.

Figure 3:
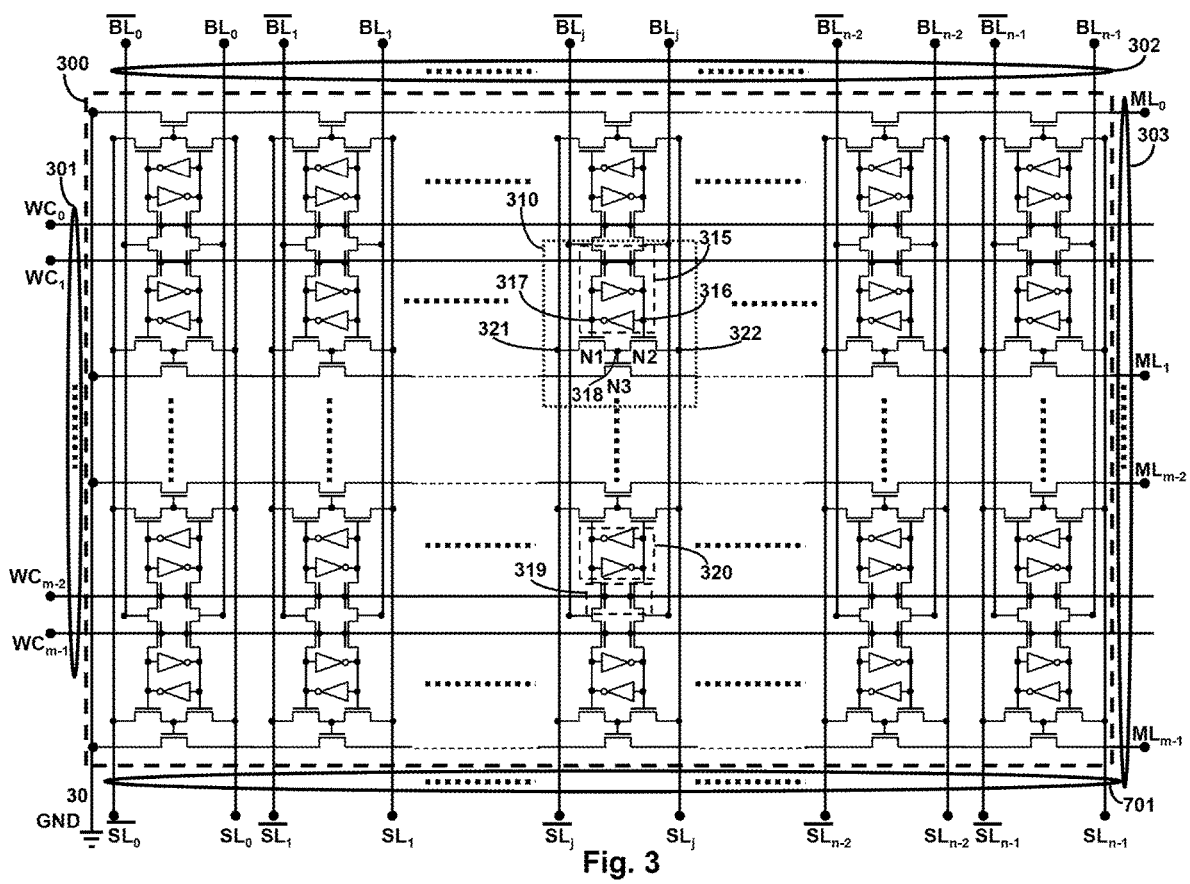
FIG. 3 shows the schematic of an n*m series CAM array according to one embodiment of the invention.

In one embodiment, FIG. 3 shows the schematic of an n-column by m-row CAM array 300. Each CAM cell 310 consists of a typical 6T (Transistors) SRAM cell 315, a complementary pair of NMOSFET (N-type Metal Oxide Semiconductor Field Effect Transistor) devices N1 and N2, and a switching NMOSFET device N3. Each 6T SRAM cell 315 includes two latched inverters 320 and two access transistors 319. The two complementary nodes 316 and 317 of the latched inverters 320 in the 6T SRAM cell 315 are connected to the gates of the complementary pair of NMOSFET device N1 and N2, respectively. The output common electrode 318 of the complementary pair device N1 and N2 is connected to the gate of the switching NMOSFET device N3. Each wordline $WC_i$ is formed by a row of gates of the access transistors 319 of the 6T SRAM cell 315 in each CAM cell 310. The "m" rows of gates of the access transistors 319 in the "n*m" CAM array 300 thus form the "m" rows of wordlines 301, $WC_i$, for i=0, . . . , (m−1), shown in FIG. 3. The "2*n" Bit-Lines 302, $BL_j$ and $\overline{BL_j}$, for j=0, . . . , (n−1), including the complementary bitlines of the CAM array 300 are formed by the "n" columns of 6T SRAM cells 315. Each Search-Line $SL_j$ and its complementary Search-Line $\overline{SL_j}$ are formed by a column of connecting electrodes 321 and 322 of the complementary pairs of NMOSFET devices N1 and N2, respectively. The "2*n" Search-Lines 901 are formed by "n" columns of $SL_j$ and $\overline{SL_j}$, j=0, . . . , (n−1). A row of "n" switching NMOSFET devices N3 are series-connected to form a single match-line. The total number m of match-lines 303 are formed in the "n*m" CAM array 300.

Figure 4:
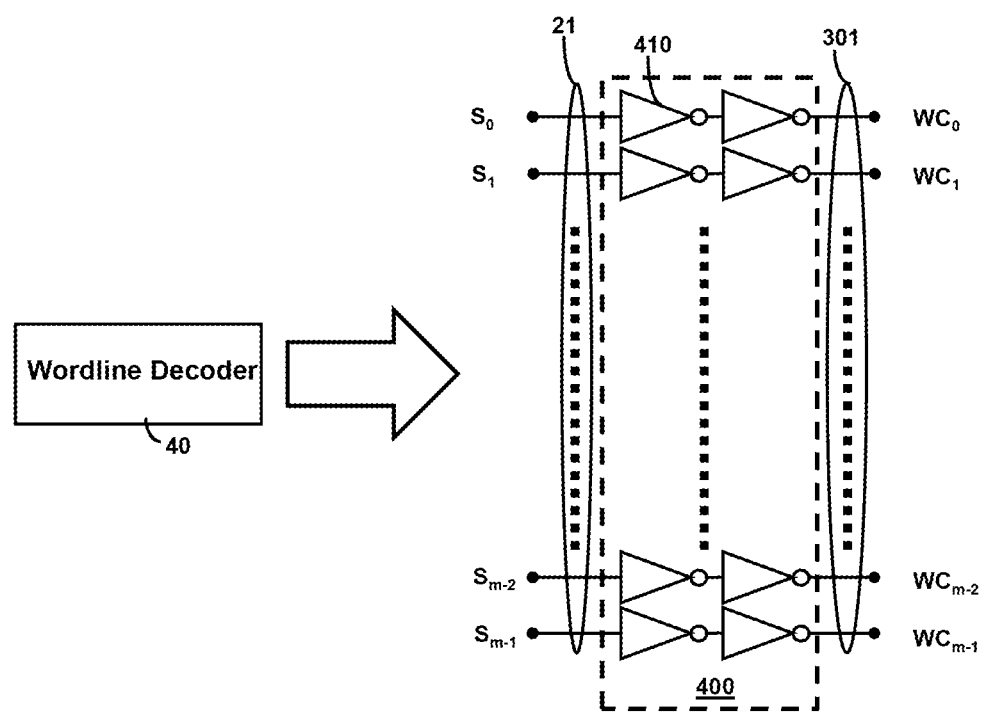
FIG. 4 shows the schematic of the Write Wordline Driver Unit with a Wordline Decoder according to one embodiment of the invention.
Figure 5:
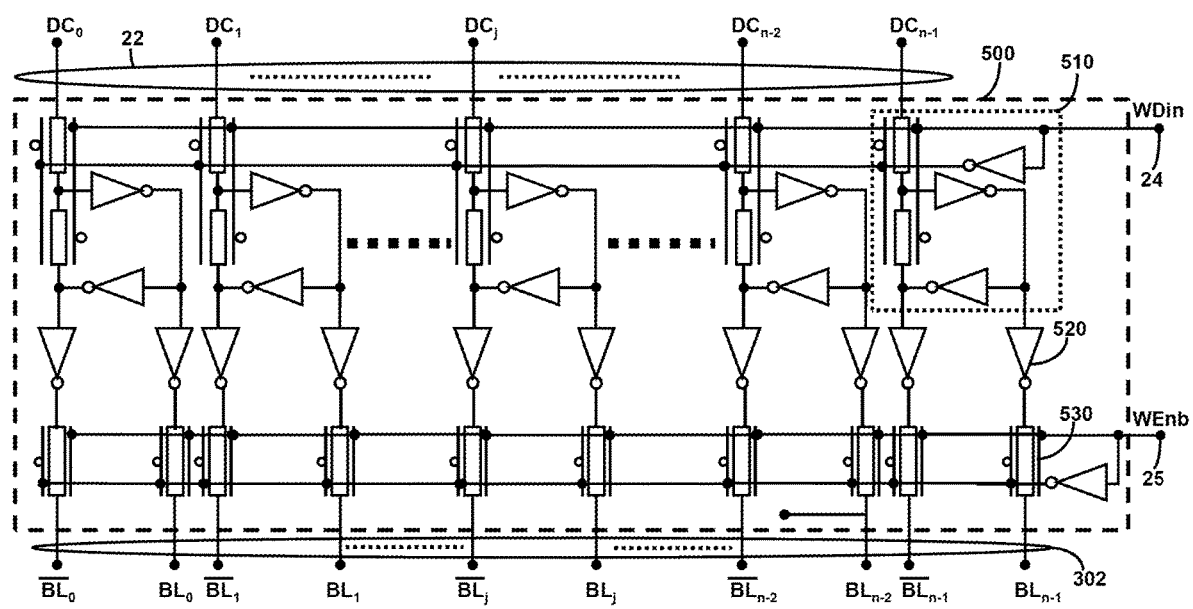
FIG. 5 shows the schematic of the n-bit SRAM Write Driver Unit for the CAM array according to one embodiment of the invention.

The wordlines 301, $WC_i$ for i=0, . . . , (m−1), are connected to a Write Wordline Driver Unit 400 shown in FIG. 4. The 2*n Bit-Lines 302 of the CAM array 300 are connected to an n-bit SRAM Write Driver Unit 500 shown in FIG. 5. A wordline decoder 40 decodes an address code to activate the high voltage signal $V_{DD}$ at the selection node $S_i$ in the lines 21 and the high voltage signal $V_{DD}$ at the selected wordline $WC_i$ in the wordlines 301. The selected wordline $WC_i$ is then turned on by the two-stage inverter buffers 410 in the Write Wordline Driver Unit 400 in FIG. 4 according to the activated selection node $S_i$. In FIG. 5, the SRAM Write Driver Unit 500 consists of a number n of data flip-flop units 510 for storing a row of write-content data received from the Bus-Lines $DC_j$ 22 for j=0, . . . , (n−1), activated by the WDin signal with a high voltage $V_{DD}$ at node 24, a number 2*n of inverter drivers 520 for driving a row of write data voltage signals onto the Bit-Lines 302, and a number 2*n of transmission gates 530 turned on by the WEnb signal with a high voltage $V_{DD}$ at node 25 for connecting the write data voltage signals onto the 2*n Bit-Lines 302 of CAM array 300.

Figure 6:
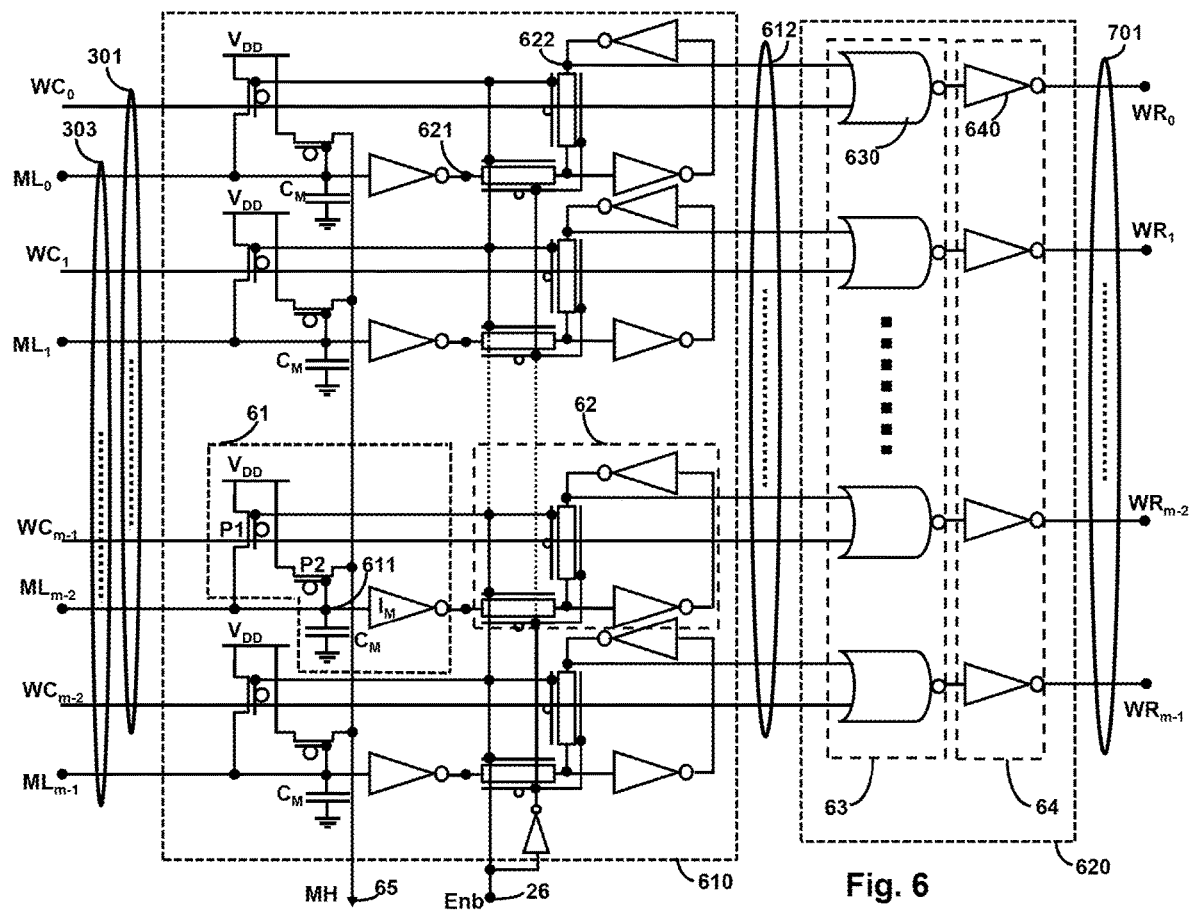
FIG. 6 shows the schematics of the Match-Detector Unit and the Write Selection and Wordline Driver Unit according to one embodiment of the invention.

The right-hand nodes of "m" match-lines 303 and the continuous wordline Bus-Llines 301 from the CAM array 300 in FIG. 3 are connected to the Match-Detector Unit 610 and the Write Selection and Wordline Driver Unit 620, respectively. In FIG. 6, the Match-Detector Unit 610 includes a number "m" of match-detectors 61 for sensing the voltage potentials at nodes 611 connected with the right-hand nodes of the match-lines 303 and a number m of flip-flops 62 for storing the matching status data of the match-lines 303. Each match-detector 61 consists of a high voltage supply PMOSFET device P1, a matching PMOSFET device P2, an inverter $I_M$, and a charging capacitor $C_M$. When a match-detector 61 is activated by the Enb signal with a high voltage $V_{DD}$ at node 26, its high voltage supply PMOSFET device P1 are turned off to disconnect the capacitor node 611 attached with the correspondent match-line from the high voltage supply rail $V_{DD}$. Since the matched match-line with the attached match-detector 61 discharges to the ground voltage potential for the input data matched with the row of content data stored in the CAM array 300, the voltage potential at node 611 will drop below the threshold voltage of the inverter $I_M$ to flip to the high voltage state at the output node 621. Meanwhile the voltage potential of a match signal MH at node 65 will be charged by one of the MOSFET devices P2 to the high voltage $V_{DD}$, if there is a row of content data matched with the inputted data. The output voltage signal of the inverter $I_M$ is then stored in the match-status flip-flop 62. For each row, the output at node 622 of the match status data flip-flop and the continuous wordline $WC_i$ of the same row in the wordlines 301 are connected to the inputs of an NOR gate 630 in the wordline selection unit 63. The output of the NOR gate 630 is then connected to an inverter buffer 640 in the driver unit 64 to activate the selected wordline $WR_i$ for the matched match-line situation and the writing row SRAM data situation in the response SRAM array 700 as shown in FIG. 7.

Figure 7:
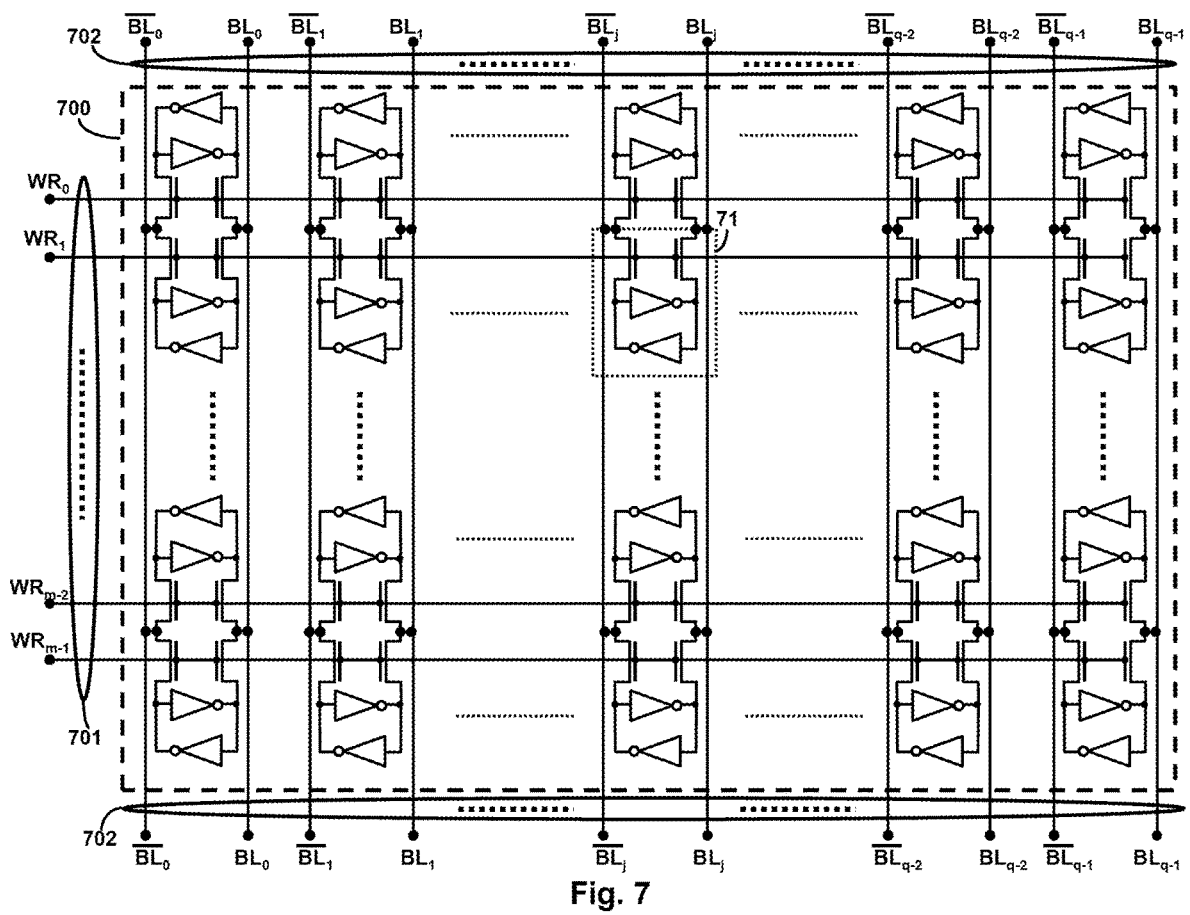
FIG. 7 shows the schematic of the SRAM array according to one embodiment of the invention.
Figure 8:
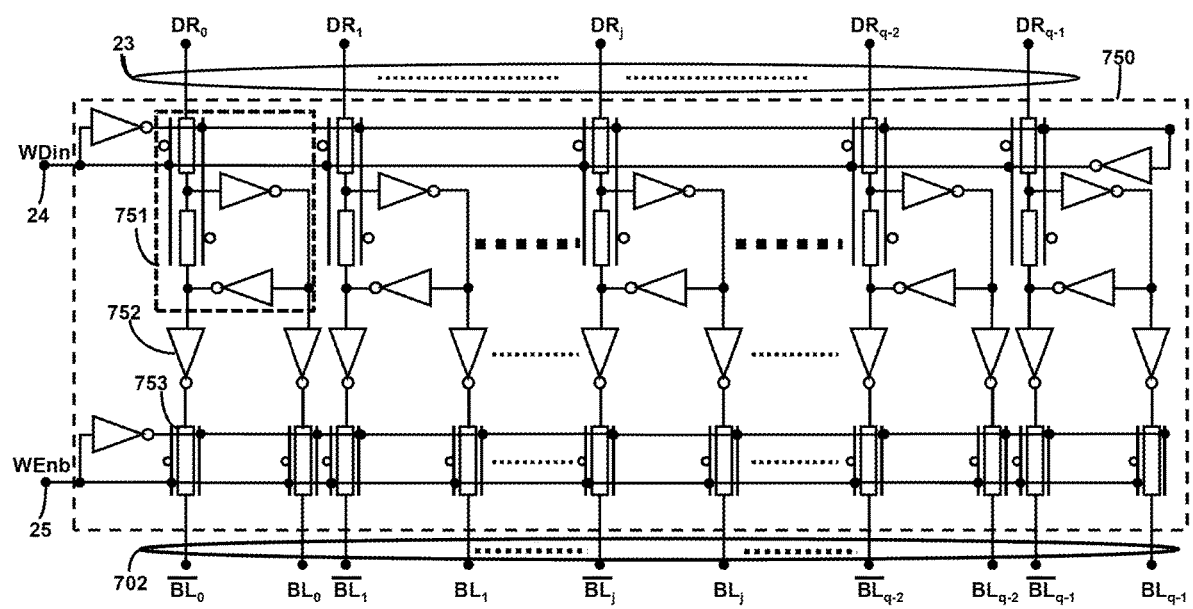
FIG. 8 shows the schematic of the q-bit SRAM Write Driver Unit according to one embodiment of the invention.

FIG. 7 shows the schematic of a typical q-column by m-row SRAM array 700. Each cell 71 is a typical SRAM cell made up of six transistors. The wordlines, $WR_i$ 701 for i=0, 1, . . . , (m−1), of the SRAM array 700 are connected to the outputs of the Write Selection and Wordline Driver Unit 620. The "2*q" bitlines/complementary bitlines (Bit-Lines) 702 of the SRAM array 700 are connected to both the q-bit SRAM Write Driver Unit 750 for writing the response data and the q-bit Output Buffer and Driver Unit 110 for readout the response data. The schematic of the q-bit SRAM Write Driver Unit 750 is shown in FIG. 8. The q-bit SRAM Write Driver Unit 750 consists of a number q of data flip-flops 751 for storing a row of response data received from the Bus-Lines 23 at $DR_j$ (for j=0, . . . , (q−1)) by the WDin signal with a high voltage $V_{DD}$ at node 24, a number 2*q of inverter drivers 752 for driving the response data to the SRAM Bit-Lines 702, and a number 2*n of transmission gates 753 activated by the WEnb signal with a high voltage $V_{DD}$ at node 25 for writing the data voltage signals into the Bit-Lines 702 of the SRAM array 700. When the control signal "WDin" at node 24 has a high voltage $V_{DD}$, the SRAM Write Driver Units 500 and 750 receive and store a row of n-bit SRAM data signals and a row of q-bit SRAM data signals from the write-content Bus-Lines 22 and the write-response Bus-Lines 23, respectively. While the write enable signal ("WEnb") has a high voltage $V_{DD}$ at node 25, the SRAM Write Driver Units 500 and 750 simultaneously write a row of n-bit content data and a row of q-bit response data respectively into the Bit-Lines 302 of CAM array 300 and the Bit-Lines 702 of SRAM array 700 with a selected wordline activated by the Write Wordline Driver Unit 400 and the Write Selection and Wordline Driver Unit 620. One of the wordlines 701 is selected by activating a high voltage signal $V_{DD}$ at one of the wordline selection nodes $WR_i$, for i=0, . . . , (m−1), connected to the outputs of the Write Selection and Wordline Driver Unit 620. The n-bit content data for the CAM array 300 and the q-bit response data for the response SRAM array 700 are then written row by row up to the "m" rows of the memory arrays 300 and 700.

Figure 1:
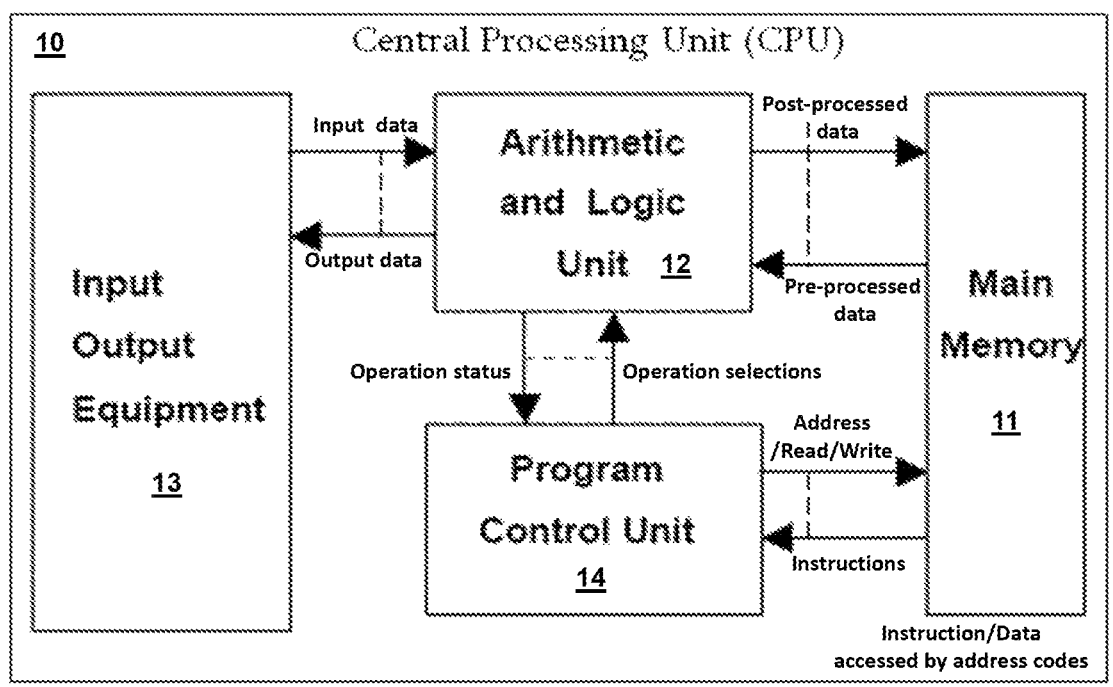
FIG. 1 shows the conventional Von-Neumann computing architecture for a typical Central Processing Unit (CPU).
Figure 2:
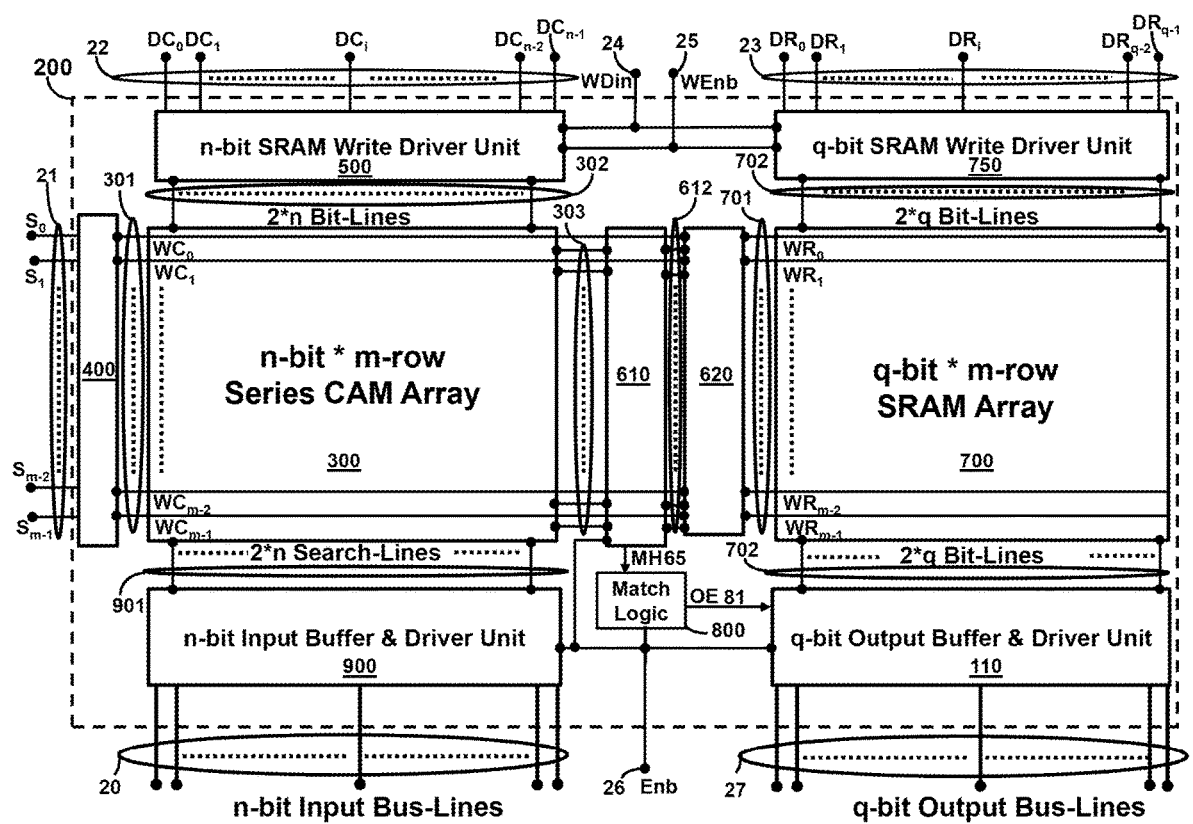
FIG. 2 shows the block diagram of the "Working Digital Perceptron (WDP)" according to the invention.
Figure 9:
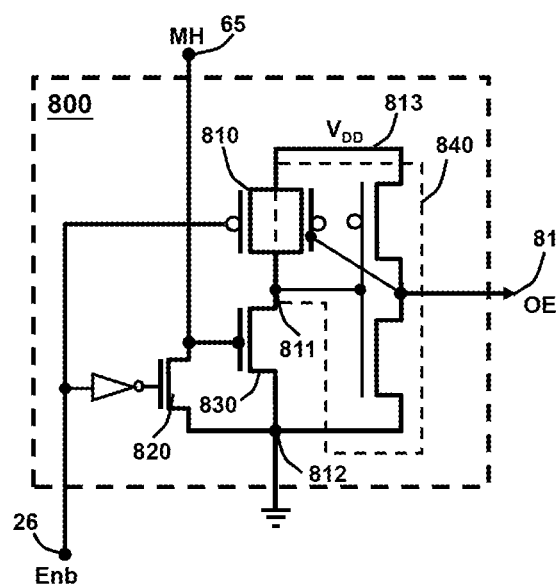
FIG. 9 shows the schematic of the Match Logic Unit for the WDP according to one embodiment of the invention.

FIG. 9 shows the schematic for the Match Logic Unit 800. When the node 26 is not activated with $V_{SS}$ (i.e., node 26 having a ground voltage), the PMOSFET 810 and the NMOSFET 820 are both "on" to have the voltage potential $V_{DD}$ at node 811 such that the voltage potential at the output node 81 of the half latch 840 is $V_{SS}$. When the node 26 is activated by the high voltage signal $V_{DD}$ to turn off both PMOSFET 810 and NMOSFET 820, the NMOSEFT 830 is "on" only with a match signal MH having a high voltage $V_{DD}$ at the node 65 to pull down the voltage potential at node 811 to the ground potential such that the voltage potential at the output node 81 of the half latch 840 is the high voltage signal $V_{DD}$. Therefore the $V_{DD}$ voltage signal at the node 81 of the half latch 840 is able to connect the q-bit Output Buffer and Driver Unit 110 to the q-bit Output Bus-Lines 27 only for a match signal MH having a high voltage $V_{DD}$ at the node 65 in FIG. 2. Accordingly, if the n-bit input data match one row of n-bit content data in memory array 300, the match signal MH with a high voltage $V_{DD}$ from one of the match-detectors 61 enables the Match Logic Unit 800 to output an OE signal with a high voltage $V_{DD}$ at the node 81 to connect the q-bit Output Buffer and Driver Unit 110 with the q-bit Output Bus-Lines 27. Otherwise, the q-bit Output Buffer and Driver Unit 110 is not connected with the q-bit Output Bus-Lines 27 for the "no-match" content memory situation.

Figure 10:
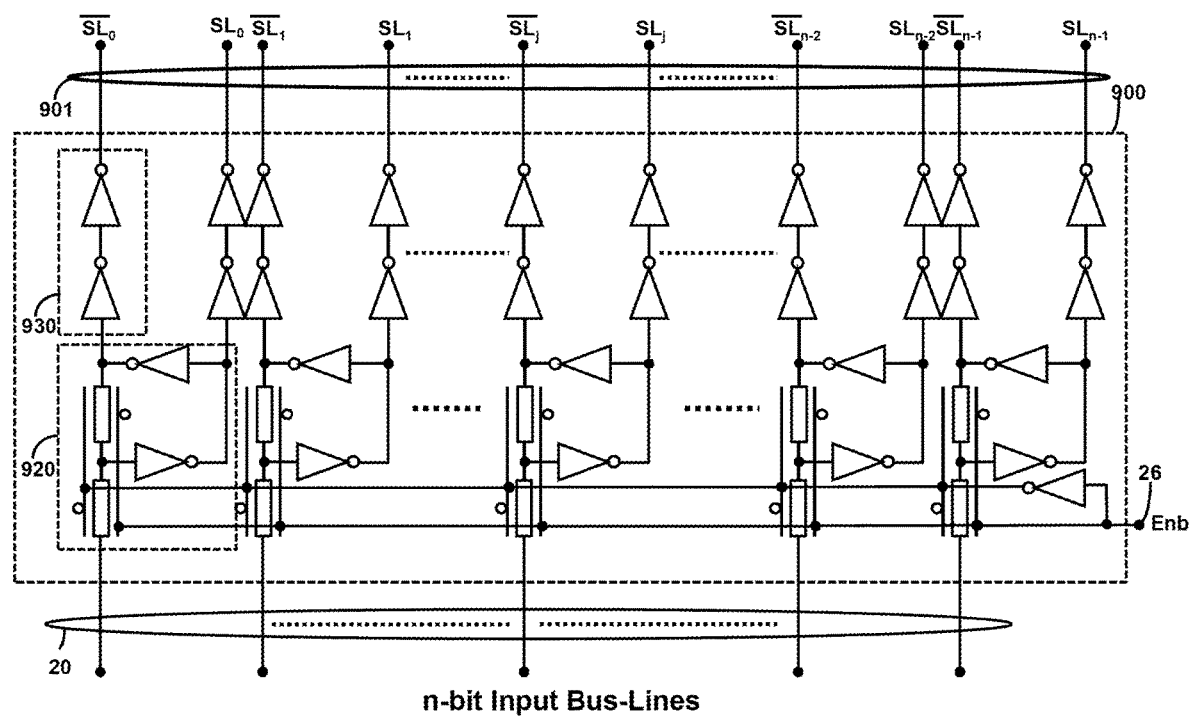
FIG. 10 shows the schematic of n-bit Input Buffer and Driver Unit according to one embodiment of the invention.

FIG. 10 shows the schematic of the n-bit Input Buffer and Driver Unit 900 consisting of a number n of data flip-flips 920 for storing the n-bit inputted data and a number 2*n of two-stage inverter drivers 930 for driving the voltage signals onto the Search-Lines 901. When the WDP 200 is enabled by the signal Enb with a high voltage $V_{DD}$, the n-bit flip-flops 920 receive the n-bit data voltage signals from the n-bit Input Bus-Lines 20 and the "2*n" two-stage inverter drivers 930 drive the applied voltage signals onto the Search-Lines 901, i.e., $SL_j$ and $\overline{SL_j}$, for j=0, . . . , (n−1), connected to the CAM array 300. As shown in FIG. 3, whenever there is a bit match for the input bit with a CAM cell 310, the applied voltage $V_{DD}$, on the search-line $SL_j$ for the inputted datum "1" and on the complementary search-line $\overline{SL_j}$ for the inputted datum "0", is passed by the "on" MOSFET device N2 for storing the content datum "1" and the "on" MOSFET device N1 for storing the content datum "0", respectively to its common output node 318 (see FIG. 3). The voltage potential $V_c<\sim V_{DD}$ at each output common node 318 is then able to turn on the switching transistor N3. Since each match-line $ML_i$ is formed by the $i^{th}$ row of series-connected switching transistors N3 with the left-hand node tied to the ground node 30 and the right-hand node connected to the corresponding match-detector 61, the voltage potential at the right-hand node is connected to the ground voltage for the entire row of turned-on transistors N3 in the case of the string of inputted data string matching the entire row of content data in the CAM memory array 300. On the other hand, if the voltage signals of inputted data string do not match the entire row of content data in the CAM array 300, the right-hand node for the un-matched match-line remain floating due to the fact that any of the turned-off transistors N3 in the row of un-matched match-line breaks the electrical connection to the ground potential at the left-hand node.

Figure 11:
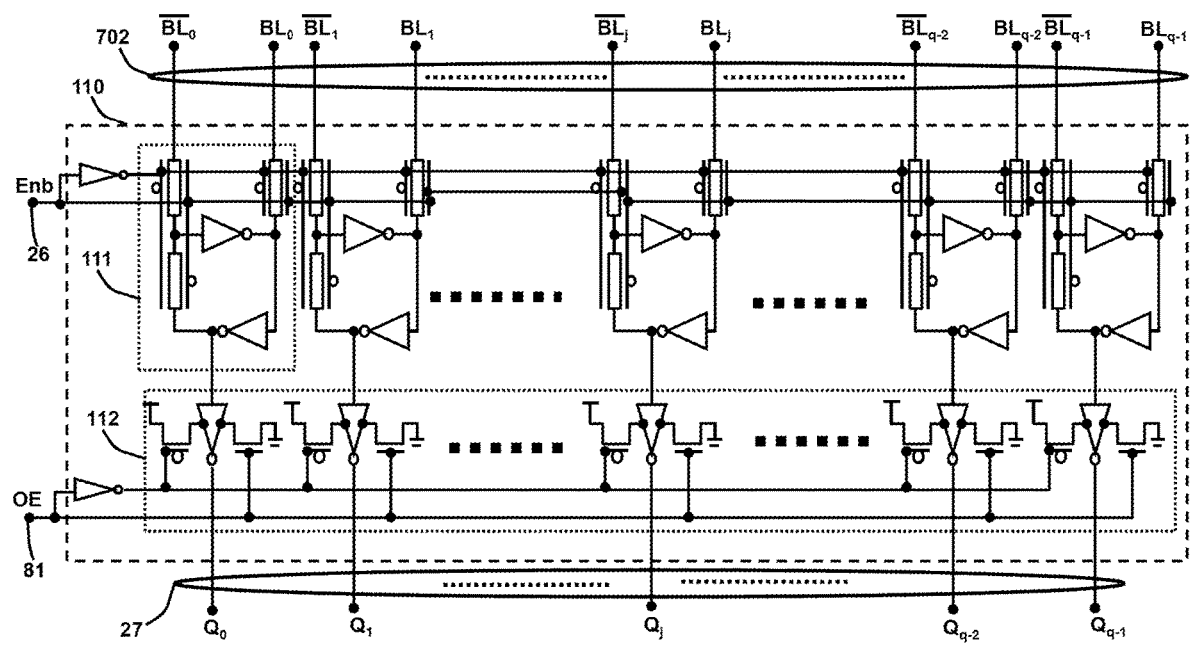
FIG. 11 shows the schematic of q-bit Output Buffer and Driver Unit according to one embodiment of the invention.

When one of the wordlines 701 in the SRAM array 700 is turned on by the Match-Detector Unit 610 and Write Selection and Wordline Driver Unit 620, the q-bit voltage signals of the correspondent row in the SRAM array 700 are sent to the number q of output data flip-flops 111 shown in FIG. 11 by the Enb signal with a high voltage $V_{DD}$. The OE signal with a high voltage $V_{DD}$ at node 81 from the Match Logic Unit 800 in FIG. 9 enables the q-bit Output Buffer and Driver Unit 112 to connect the Output Bus-Lines 27 $Q_j$, for j=0, . . . , (q−1) in FIG. 2. The "q-bit" output voltage signals of the response data in the WDP 200 are then passed to the q-bit Output Bus-Lines 27 to other digital circuit units.

The aforementioned description of the preferred embodiments of the invention has been presented for purposes of illustration and description. It is not intended to be exhaustive or to limit the invention to the precise form or to exemplary embodiment disclosed. Accordingly, the description should be regarded as illustrative rather than restrictive. The embodiment is chosen and described in order to best explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. The abstract of the disclosure is provided to comply with the rules requiring an abstract, which will allow a searcher to quickly ascertain the subject matter of the technical disclosure of any patent issued from this disclosure. It is submitted with the understanding that it will not be used to interpret or limit the scope or meaning of the claims. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A dynamic digital perceptron device, comprising:
a volatile content memory array comprising m rows by n columns of first memory cells for parallel comparing a n-bit input symbol with a number m of n-bit content symbols pre-stored in the m rows of first memory cells, wherein each row of the first memory cells generates an indication signal indicative of whether the n-bit input symbol matches its pre-stored n-bit content symbol;
a detection and driver circuit for respectively applying a number m of second switching signals to a number m of second wordlines of a volatile response memory array in response to a number m of indication signals and a number m of first switching signals on a number m of first wordlines of the volatile content memory array; and
the volatile response memory array comprising m rows by q columns of second memory cells, wherein the m rows of second memory cells respectively pre-store a number m of q-bit response symbols, wherein m, n and q are integers greater than zero;
wherein when a second switching signal and a first control signal are activated, a corresponding row of second memory cells is switched on to output its pre-stored q-bit response symbol as a q-bit output symbol;
wherein the volatile content memory array and the volatile response memory array respectively pre-store the number m of n-bit content symbols and the number m of q-bit response symbols in a row-by-row manner; and
wherein the first memory cells and the second memory cells in the same row simultaneously pre-store a corresponding n-bit content symbol and a corresponding q-bit response symbol according to a corresponding activated first switching signal and a corresponding activated second switching signal.

2. The dynamic digital perceptron device according to claim 1, wherein if all the second switching signals are de-activated, the volatile response memory array outputs no q-bit response symbols.

3. The dynamic digital perceptron device according to claim 1, wherein the detection and driver circuit further activates zero or one of the number m of second switching signals and activates a match signal in response to the first control signal, the number m of indication signals and the number m of first switching signals, wherein the first control signal is activated when the dynamic digital perceptron device is activated, and wherein the match signal is activated when the n-bit input symbol matches one of the number m of n-bit content symbols.

4. The dynamic digital perceptron device according to claim 3, wherein the detection and driver circuit comprises a number m of sensing cells, each comprising:
    a match-detector for receiving the first control signal and a corresponding indication signal to generate a sensing signal;
    a flip-flop connected between the match-detector and a driving unit for storing the sensing signal in response to the first control signal; and
    the driving unit for activating a corresponding second switching signal in response to the sensing signal and a corresponding first switching signal on a corresponding first wordline.

5. The dynamic digital perceptron device according to claim 4, wherein each match-detector comprises:
    a first PMOS device connected between a digital voltage rail having a digital voltage and a first connection node receiving the corresponding indication signal, a gate of the first PMOS device receiving the first control signal;
    a second PMOS device connected between the digital voltage rail and a second connection node, a gate of the second PMOS device being connected to the first connection node;
    an inverter connected between the first connection node and the flip-flop for inverting the corresponding indication signal into the sensing signal; and
    a capacitor connected between the first connection node and a ground node;
    wherein the second connection nodes for all the match-detectors are connected together to generate the match signal.

6. The dynamic digital perceptron device according to claim 3, further comprising:
    an input bus for receiving the n-bit input symbol; and
    an input buffer and driver unit connected between a number n of complementary search-line pairs of the volatile content memory array and the input bus for temporarily storing and driving the n-bit input symbol to the number n of complementary search-line pairs according to the first control signal.

7. The dynamic digital perceptron device according to claim 3, further comprising:
    an output bus; and
    an output buffer and driver unit located between a number q of complementary second bit-line pairs of the volatile response memory array and the output bus for temporarily storing the q-bit output symbol and driving the q-bit output symbol signal to the output bus, wherein whether the output buffer and driver unit is electrically connected to the number q of complementary second bit-line pairs of the volatile response memory array depends on the first control signal, and wherein whether the output buffer and driver unit is electrically connected to the output bus depends on the match signal.

8. The dynamic digital perceptron device according to claim 3, further comprising:
    a wordline decoder and driver circuitry for decoding an address signal, activating one of the number m of first switching signals and respectively applying the number m of first switching signals to the number m of first wordlines;
    an n-bit data bus;
    a q-bit data bus;
    an n-bit write driver circuitry for connecting to the n-bit data bus according to a second control signal and writing one of the number m of n-bit content symbols from the n-bit data bus to the volatile content memory array according to a third control signal and the activated first switching signal; and
    a q-bit write driver circuitry for connecting to the q-bit data bus according to the second control signal and writing one of the number m of q-bit response symbols from the q-bit data bus to the volatile response memory array according to the third control signal and the activated second switching signal;
    wherein the second and the third control signals are activated before the first control signal is activated.

9. The dynamic digital perceptron device according to claim 1, wherein the volatile content memory array further comprises:
    a number m of match-lines, each generating a corresponding indication signal and being formed by series-connected switching transistors of the first memory cells in a row;
    a number n of complementary search-line pairs for receiving the n-bit input symbol, each complementary search-line pair being connected to the first memory cells in a column;
    a number n of complementary first bit-line pairs for receiving the number m of n-bit content symbols, each complementary first bit-line pair being connected to the first memory cells in a column; and
    a common source line for connecting the same-side terminals of the match-lines altogether to a predetermined voltage terminal.

10. The dynamic digital perceptron device according to claim 9, wherein each first memory cell comprises:
    a SRAM cell comprising:
        a latch having a first output node and a second output node; and
        a first access transistor and a second access transistor, the first access transistor being connected between the first output node and one of a corresponding complementary first bit-line pair, the second access transistor being connected between the second output node and the other one of the corresponding complementary first bit-line pair;
    a first NMOS device, a gate of which is connected to the first output node;
    a second NMOM device, a gate of which is connected to the second output node; and
    the switching transistor, wherein first terminals of the first NMOS device and the second NMOS device are connected together to a gate electrode of the switching transistor, a second terminal of the first NMOS device being connected to one of a corresponding complementary search-line pair, a second terminal of the second NMOS device being connected to the other one of the corresponding complementary search-line pair.

11. The dynamic digital perceptron device according to claim 1, wherein the q-bit output symbol is autonomously processed with the n-bit input symbol according to the number m of n-bit content symbols and the number m of q-bit response symbols.

12. The dynamic digital perceptron device according to claim 1, wherein the number m of n-bit content symbols in the volatile content memory array and the number m of q-bit response symbols in the volatile response memory array are adaptively updated for a fast and frequent changing information processing environment.

13. A method for operating a dynamic digital perceptron device comprising a volatile content memory array and a volatile response memory array, the method comprising:
respectively pre-storing a number m of n-bit content symbols and a number m of q-bit response symbols in the volatile content memory array and the volatile response memory array in a row-by-row manner;
parallel comparing an n-bit input symbol with the number m of n-bit content symbols pre-stored in the volatile content memory array comprising m rows by n columns of first memory cells so that each row of first memory cells generates an indication signal indicative of whether the n-bit input symbol matches its pre-stored n-bit content symbol;
respectively applying a number m of second switching signals to a number m of second wordlines in the volatile response memory array having m rows by q columns of second memory cells according to a number m of indication signals and a number m of first switching signals on a number m of first wordlines of the volatile content memory array, wherein the m rows of second memory cells respectively pre-store the number m of q-bit response symbols, wherein m, n and q are integers greater than zero; and
switching on a corresponding row of second memory cells to output its pre-stored q-bit response symbol as a q-bit output symbol in response to a received activated second switching signal and an activated first control signal;
wherein the step of respectively pre-storing comprises:
simultaneously pre-storing a corresponding n-bit content symbol and a corresponding q-bit response symbol in the first memory cells and the second memory cells in the same row according to a corresponding activated first switching signal and a corresponding activated second switching signal.

14. The method according to claim 13, further comprising:
if all the second switching signals are de-activated, outputting no q-bit response symbol by the volatile response memory array.

15. The method according to claim 13, further comprising:
prior to the step of parallel comparing and after the step of respectively pre-storing, activating the first control signal to activate the dynamic digital perceptron device.

16. The method according to claim 15, wherein the step of respectively applying comprises:
respectively generating a number m of sensing signals and activating a match signal based on the m indication signals and the first control signal;
respectively storing the number m of sensing signals based on the first control signal; and
activating zero or one of the number m of second switching signals according to the number m of sensing signals and the number m of first switching signals on the number m of first wordlines;
wherein the match signal is activated when the n-bit input symbol matches one of the number m of n-bit content symbols and the first control signal is activated.

17. The method according to claim 15, further comprising:
prior to the step of parallel comparing and after the step of respectively pre-storing, temporarily storing the n-bit input symbol; and
driving the n-bit input symbol to a number n of complementary search-line pairs in the volatile content memory array according to the first control signal.

18. The method according to claim 16, further comprising:
after the step of switching on, temporarily storing the q-bit output symbol according to the first control signal; and
driving the q-bit output symbol to an output bus according to the match signal.

19. The method according to claim 13, wherein the q-bit output symbol is autonomously processed with the n-bit input symbol according to the number m of n-bit content symbols and the number m of q-bit response symbols.

20. The method according to claim 13, wherein the step of respectively pre-storing comprises:
(a) decoding an address signal to activate one of the number m of first switching signals;
(b) respectively applying the number m of first switching signals to the number m of first wordlines;
(c) activating one of the second switching signals according to the activated first switching signal;
(d) respectively applying the number m of second switching signals to the number m of second wordlines;
(e) writing an n-bit content symbol to the volatile content memory array according to a second control signal and the activated first switching signal;
(f) writing a q-bit response symbol to the volatile response memory array according to the second control signal and the activated second switching signal; and
(g) repeating steps (a) to (1) until the number m of n-bit content symbols and the number m of q-bit response symbols are written into the volatile content memory array and the volatile response memory array.

21. The method according to claim 13, further comprising:
after the step of switching on, adaptively writing a number m of updated n-bit content symbols into the volatile content memory array and a number m of updated q-bit response symbols into the volatile response memory array for a fast and frequent changing information processing environment.

* * * * *